United States Patent
Narayanaswamy et al.

(10) Patent No.: US 8,320,210 B2
(45) Date of Patent: Nov. 27, 2012

(54) MEMORY CIRCUIT AND A TRACKING CIRCUIT THEREOF

(75) Inventors: Santhosh Narayanaswamy, Bangalore (IN); Sharad Gupta, Kanpur (IN); Lakshmikantha V Holla, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 170 days.

(21) Appl. No.: 12/979,390

(22) Filed: Dec. 28, 2010

(65) Prior Publication Data

US 2012/0163109 A1    Jun. 28, 2012

(51) Int. Cl.
    *G11C 7/02*    (2006.01)

(52) U.S. Cl. ............. 365/210.1; 365/185.2; 365/189.09; 365/210.14; 365/210.15

(58) Field of Classification Search ............... 365/185.2, 365/210.1, 189.09, 210.14, 210.15
See application file for complete search history.

(56) References Cited

U.S. PATENT DOCUMENTS

2005/0169078 A1*    8/2005    Balasubramanian et al.    365/207
* cited by examiner

*Primary Examiner* — Jason Lappas
(74) *Attorney, Agent, or Firm* — John R. Pessetto; W. James Brady; Frederick J. Telecky, Jr.

(57) ABSTRACT

Memory circuit and a tracking circuit thereof. The tracking circuit includes a dummy bit line (DBL). The tracking circuit further includes a first circuit to discharge the dummy bit line in response to a first signal and a wordline activation signal. The wordline activation signal causes activation of a memory cell. The tracking circuit also includes a second circuit which is responsive to discharge of the dummy bit line to enable access to the memory cell.

9 Claims, 6 Drawing Sheets

MEMORY CIRCUIT AND A TRACKING CIRCUIT THEREOF

TECHNICAL FIELD

Embodiments of the disclosure relate to a memory circuit and a tracking circuit thereof.

BACKGROUND

A clock signal may reach different parts of a memory circuit through different paths and hence at different times. Process variations and variations in associated voltage supply can add to these time differences. Such time differences can cause incorrect read or write operations. Tracking circuits have been used to compensate for these time differences. However, the tracking circuits operate on a worst-case basis and hence the tracking circuits degrade performance of the memory circuit. In a retention-till-access (RTA) memory, an RTA mode of operation accounts for worst-case timing differences. The tracking circuit operates on the worst-case basis even when the memory circuit is not being operated in the RTA mode. Hence, there is a need for a way to compensate for the timing differences in the memory circuit, in one or more modes of operation, with minimal performance degradation.

SUMMARY

An example of a tracking circuit includes a dummy bit line (DBL). The tracking circuit further includes a first circuit to discharge the dummy bit line in response to a first signal and a wordline activation signal. The wordline activation signal causes activation of a memory cell. The tracking circuit also includes a second circuit which is responsive to discharge of the dummy bit line to enable access to the memory cell.

An example of a memory circuit includes a clock circuit to generate a first clock signal and a second clock signal. The memory circuit also includes a retention-till-access switch responsive to the second clock signal to generate a first signal and a wordline header signal. Further, the memory circuit includes a wordline driver responsive to the first clock signal and to the wordline header signal to drive a wordline to render a memory cell to be ready for access. The memory circuit also includes a first circuit responsive to the second clock signal and to the wordline header signal to track a wordline path from the clock circuit to the wordline and to generate a wordline activation signal. The memory circuit further includes a dummy bit line responsive to a logical combination of the first signal and the wordline activation signal to discharge through the first circuit. Moreover, the memory circuit includes a second circuit responsive to discharge of the dummy bit line to generate a second signal based on peripheral voltage supply variations. The memory circuit also includes a pulse generator responsive to the second signal to generate an enable signal. Furthermore, the memory circuit includes a sense amplifier responsive to the enable signal to access the memory cell.

An example of a method includes generating a wordline activation signal in response to activation of a wordline. The method also includes discharging a dummy bit line based on a logical combination of a first signal and the wordline activation signal. The method further includes enabling access to a memory cell in response to the discharging. The memory cell is coupled to the wordline.

BRIEF DESCRIPTION OF THE VIEWS OF DRAWINGS

The drawings illustrate various embodiments and explain certain aspects and advantages of the invention. They are illustrative only and are not to be taken as limiting the invention in any way. Like reference numerals are used in the various drawings to refer to like elements.

DETAILED DESCRIPTION OF THE EMBODIMENTS

Figure 1:
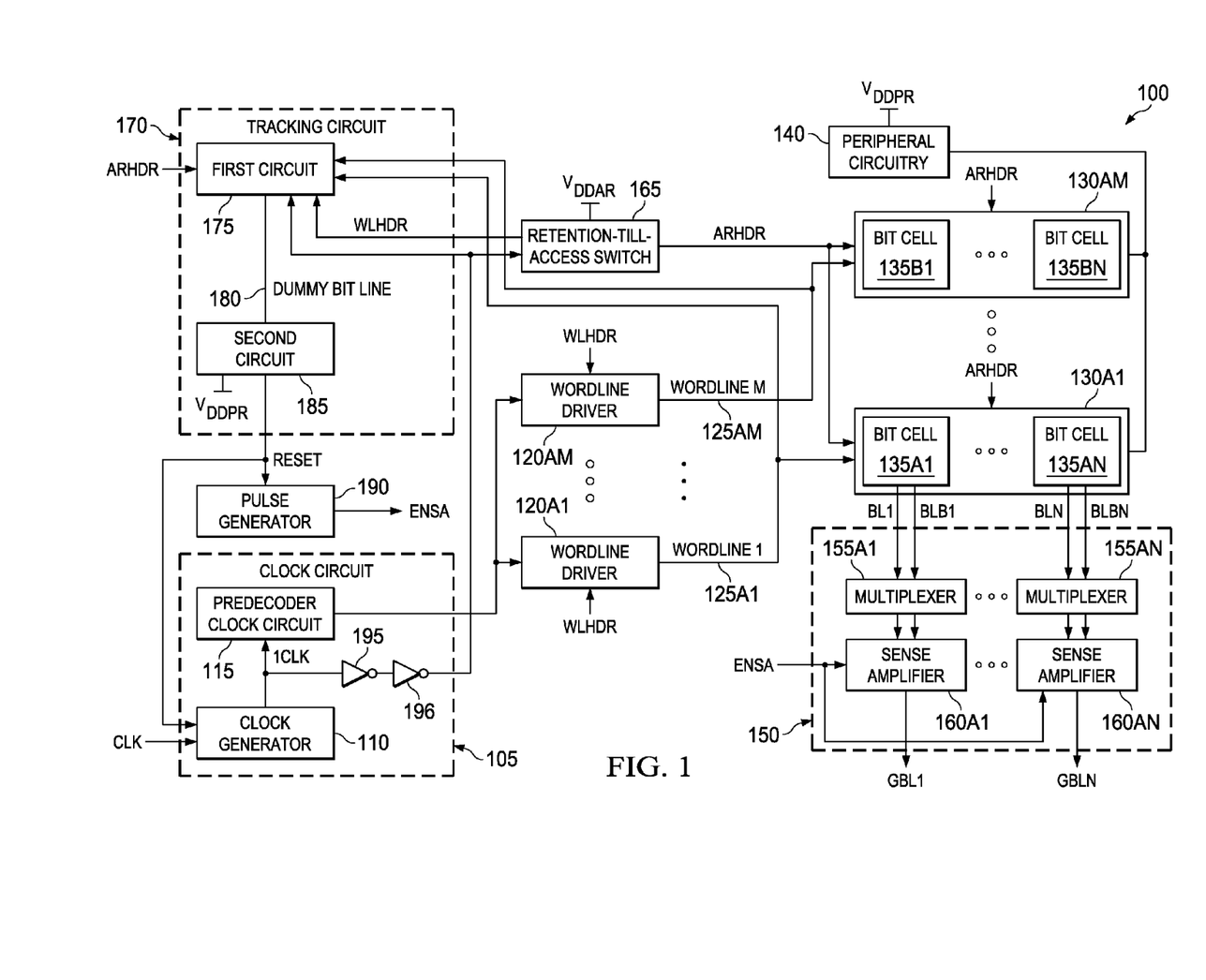
FIG. 1 is a block diagram of a memory circuit, in accordance with one embodiment.

FIG. 1 illustrates a memory circuit 100. The memory circuit 100 can be a retention-till-access (RTA) type of memory. An RTA memory is a memory that employs a technique of reducing power leakage in memory cells by automatically lowering the power being supplied to the memory cells when the memory cells are not being accessed. This is done by reducing voltage. Even though the voltage is lowered, data in the memory cells is maintained. The RTA memory has two modes of operation, an RTA mode and a non-RTA mode. In the non-RTA mode, voltages are maintained at the same level whether or not the memory cells are being accessed.

This disclosure describes embodiments that use the RTA type of memory, but the principles of the invention are applicable to non-RTA memories also.

The memory circuit 100 can be included in a static random access memory (SRAM) along with other control circuitry for the SRAM. The memory circuit 100 can also be included in a microprocessor memory cache such as a small and fast Level One (L1) cache or a larger but slower Level Two (L2) cache.

The memory circuit 100 receives power from each of two power supplies. One supply is an array power supply that provides power at an array voltage ($V_{DDAR}$) and the other supply is a peripheral power supply that provides power at a peripheral voltage ($V_{DDPR}$). $V_{DDPR}$ is subject to more variation than $V_{DDAR}$. The power supplies provide power to, respectively, an array header (not shown) and a peripheral circuitry 140.

The memory circuit 100 includes a clock circuit 105 that is coupled to an RTA switch 165 and a plurality of wordline drivers, for example a wordline driver 120A1 to a wordline driver 120AM. The RTA switch 165 is coupled to a plurality of memory arrays, for example a memory array 130A1 to a memory array 130AM. The memory arrays are coupled to the peripheral circuitry 140 and a sense amplifier circuit 150. Each wordline driver is also coupled to a respective memory array through a respective wordline. For example, the wordline driver 120A1 is coupled to the memory array 130A1 through a wordline 125A1.

The RTA switch 165 is also coupled to a tracking circuit 170. The tracking circuit 170 is coupled to a pulse generator 190. The pulse generator 190 is coupled to the clock circuit 105 and the sense amplifier circuit 150.

The clock circuit 105 includes a clock generator 110 coupled to a predecoder clock circuit 115. Two inverters, for example an inverter 195 and an inverter 196 are also coupled in series connection between the clock generator 110 and the RTA switch 165. The predecoder clock circuit 115 is coupled to the wordline drivers. The clock generator 110 is also coupled to the pulse generator 190.

The RTA switch 165 receives $V_{DDAR}$ and is also coupled to the wordline drivers.

The tracking circuit 170 includes a first circuit 175 which is coupled to a second circuit 185 through a dummy bit line 180. The first circuit 170 is coupled to the RTA switch 165, to the wordlines, and to the inverter 196. The second circuit 185 receives $V_{DDPR}$ and is coupled to the pulse generator 190.

The peripheral circuitry 140 receives $V_{DDPR}$ and is coupled to the memory arrays. Each memory array includes a plurality of memory cells (also referred to as bit cells). For example, the memory array 130A1 includes a memory cell 135A1 to 135AN. The memory arrays include the memory cells that are arranged in one or more rows and columns. The memory circuit 100 can include M rows of memory cells. In one example, M can be 16 or 32. 16 memory rows can be grouped into a block. There can be several blocks present in the memory circuit 100. One wordline is present corresponding to one row. Each memory cell can have one or more transistors. In one embodiment, the tracking circuit 170 can be present for 32 memory rows.

The sense amplifier circuit 150 includes a plurality of sense amplifiers, for example a sense amplifier 160A1 to a sense amplifier 160AN, and a plurality of multiplexers, for example a multiplexer 155A1 to a multiplexer 155AN. Each memory cell is coupled to a sense amplifier through a multiplexer. For example, the memory cell 135A1 is coupled to the sense amplifier 160A1 through the multiplexer 155A1. The memory cell 135A1 is coupled to the multiplexer 155A1 through a pair of bit lines (BL1 and BLB1). Each sense amplifier defines a corresponding global bit line (GBL). For example, the sense amplifier 160A1 defines a GBL1.

An exemplary operation of the memory circuit 100 is now explained. The memory circuit 100 has two active paths. An active path is defined as flow of current or signal. One path includes flow of signal from the clock circuit 105 to the memory array 130A1 through the wordline driver 120A1 and the wordline 125A1. Another path includes flow of signal from the clock circuit 105 to the memory array 130A1 through the tracking circuit 170, the pulse generator 190 and the sense amplifier circuit 150. The operation of the memory circuit 100 is explained using the wordline driver 120A1, the wordline 125A1, and the memory array 130A1 as an example.

In illustrated example, the memory cell 135A1 of the memory array 130A1 needs to be accessed for a read operation. It is noted that the operation of the memory circuit 100 is explained using the read operation but is applicable to a write operation also. Performing the read operation or the write operation on the memory cell 135A1 is referred to as accessing the memory cell 135A1.

An external clock signal (CLK) enables the clock generator 110 to initiate a read operation. The clock generator 110 generates an internal clock signal (ICLK). ICLK is also referred to as the clock signal. Initially, for the first time the ICLK is generated in response to the external clock signal and is subsequently generated based on a RESET signal (second signal). The predecoder clock circuit 115 generates a plurality of predecoder clock signals in response to the ICLK. The predecoder clock signals drive the wordline driver 120A1. The wordline driver 120A1 in turn drives the wordline 125A1. Driving of the wordline 125A1 indicates activation of the wordline 125A1.

The wordline 125A1 in the memory circuit 100 can become active due to the predecoder clock signals or due to charging of the array header of the memory circuit 100. The RTA switch 165 controls charging of the array header and causes a voltage of the array header to settle at a predefined voltage in the RTA mode. Initially, when the memory cells are not accessed, the voltage of the array header is at a diode supply which is equal to $V_{DDAR}-V_T$, where $V_T$ is a diode drop across a positive metal oxide semiconductor (PMOS) based diode (not shown) of the RTA switch 165. A signal indicative of the voltage of the array header is referred to as ARHDR (first signal). The array header of the memory circuit 100 is charged using a PMOS transistor switch (not shown) of the RTA 165. A gate of the PMOS transistor switch is driven by a signal at a logic level, for example a logic level HIGH or a logic level LOW. When the memory cells are to be accessed, the logic level at the gate of the PMOS transistor is at logic level LOW resulting in precharging of the array header to $V_{DDAR}$. The PMOS transistor switch can be driven by a component of the ICLK which can be obtained by delaying the ICLK using the two inverters.

The RTA switch 165 also precharges a wordline header (not shown), in response to the component of the ICLK, to generate a wordline header signal (WLHDR). The precharging of wordline header is performed in a method similar to the precharging of the array header. A signal indicative of the voltage of the wordline header is referred to as the WLHDR. ARHDR is different than the WLHDR. The RTA switch 165 generates the ARHDR before the WLHDR to prevent reduction of noise margin of the memory cells.

The wordline driver 120A1 drives the wordline 125A1 in response to the predecoder clock signals and the WLHDR. The WLHDR is a supply to the wordline driver 120A1. The wordline 125A1 is driven HIGH and a desired memory cell, for example the memory cell 135A1, coupled to the wordline 125A1 and the pair of bit lines, is then ready for access. The driving of the wordline 125A1 renders the memory cell 135A1 to be ready to be accessed. The memory cell 135A1 also requires inputs in terms of power supply through the peripheral circuitry 140. Hence, access to the memory cell 135A1 is also dependent on $V_{DDPR}$. Data in the memory cell 135A1 is reflected onto the pair of bit lines, the BL1 and the BLB1. If the data stored in the memory cell 135A1 is at logic LOW, then the BL1 is discharged from a precharged logic HIGH state to a logic LOW state. If the data stored in the memory cell 135A1 is at logic HIGH, then BLB1 is discharged from a precharged logic HIGH state to a logic LOW state. The discharging develops a differential voltage between the BL1 and the BLB1.

The sense amplifier 160A1 senses the differential voltage, using the MUX 155A1, in response to an enable signal also referred to as a sense amplifier enable signal (ENSA). Hence, it is desired that the ENSA is generated at the correct time to sense the differential voltage. The correct time can be defined as a time at which the differential voltage develops between the pair of bit lines. The differential voltage is amplified by the sense amplifier 160A1 and transferred onto the GBL1.

The ENSA is generated at the correct time by the pulse generator 190 based on tracking by the tracking circuit 170.

The tracking circuit 170 tracks a wordline path using the dummy bit line 180. The wordline path can be defined as a path from the clock circuit 105 to the wordline 125A1. In other aspect, the wordline path can be defined as the path from the clock generator 110 to the predecoder clock circuit 145 then to the wordline driver 120A1 then to the wordline 125A1. The tracking circuit 170 tracks the wordline 125A1 by generating the wordline driver signal in response to the wordline 125A1 going HIGH. When the wordline 125A1 is activated the first circuit 175 discharges the dummy bit line 180 using the first signal (ARHDR) and the wordline activation signal. The discharge of the dummy bit line 180 is indicative of the wordline 125A1 being driven HIGH. The tracking circuit 170 by tracking enables timely triggering of the sense amplifier 160A1.

The second circuit 185 generates the RESET signal (second signal) based on discharge of the dummy bit line 180. The second circuit 185 tracks discharging of the dummy bit line 180 across peripheral voltage supply variations to generate the RESET signal to enable generation of the enable signal and hence, to enable accessing of the memory cell 135A1. The RESET signal is also sent to the clock generator 110 to reset the ICLK and to reset the clock generator 110 for another read operation. The tracking circuit 170 also tracks a path from the RTA switch 155 to the wordline driver 120A1 and to the memory cells. The tracking enables triggering of the sense amplifier circuit 150 to read the memory cells correctly. The pulse generator 190 receives the RESET signal and is responsive to the RESET signal to generate the enable signal (ENSA). The sense amplifier 160A1 then receives the ENSA and is responsive to the ENSA to sense the differential voltage.

The tracking circuit 170 enables timely triggering of the sense amplifier 160A1 in order to read the data accurately. Inaccurate reading of the data occurs if the differential voltage detected is below a certain threshold voltage. The tracking circuit 170 delays enabling of the sense amplifier 160A1 in order to allow accurate reading of the data by developing sufficient differential voltage across the pair of bit lines. In order to time the triggering of the sense amplifier 160A1, the tracking circuit 170 detects when the wordline 125A1 and the pair of bit lines are selected. The dummy bit line 180 which is precharged prior to start of the read operation starts discharging once the wordline 125A1 and the pair of bit lines is selected. The second circuit 185 detects if a voltage on the dummy bit line 180 falls below a certain level. When the voltage on the dummy bit line 180 falls below a certain level, the second circuit 185 resets the pulse generator 190 to generate the ENSA. The MUX 155A1 is used to select BL1 and BLB1. The sense amplifier 160A1 detects the differential voltage across BL1 and BLB1, and amplifies the differential voltage. The differential voltage can also be referred to as a read margin. Amplified differential voltage is further outputted on the GBL1.

Figure 2:
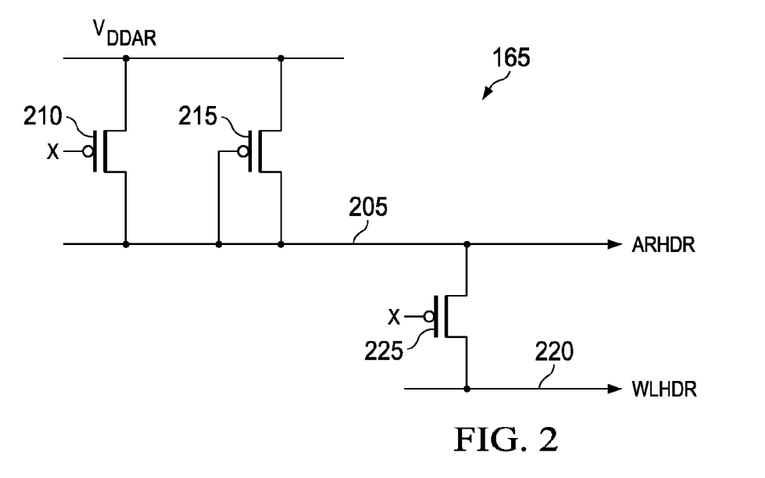
FIG. 2 is a schematic diagram of a retention-till-access switch, in accordance with one embodiment.

Referring to FIG. 2 now, the RTA switch 165 is explained. The RTA switch 165 includes a PMOS transistor 210, a PMOS transistor based diode 215, and a PMOS transistor 225. Sources of the PMOS transistor 210 and the PMOS transistor based diode 215 are coupled to the array power supply. Drains of the PMOS transistor 210 and the PMOS transistor based diode 215 are coupled to an array header 205. A source of the PMOS transistor 225 is also coupled to the array header 205. A drain of the PMOS transistor 225 is coupled to a wordline header 220. ARHDR is different than the WLHDR due to difference in load due to the array header 205 and the wordline header 220.

Figure 3A:
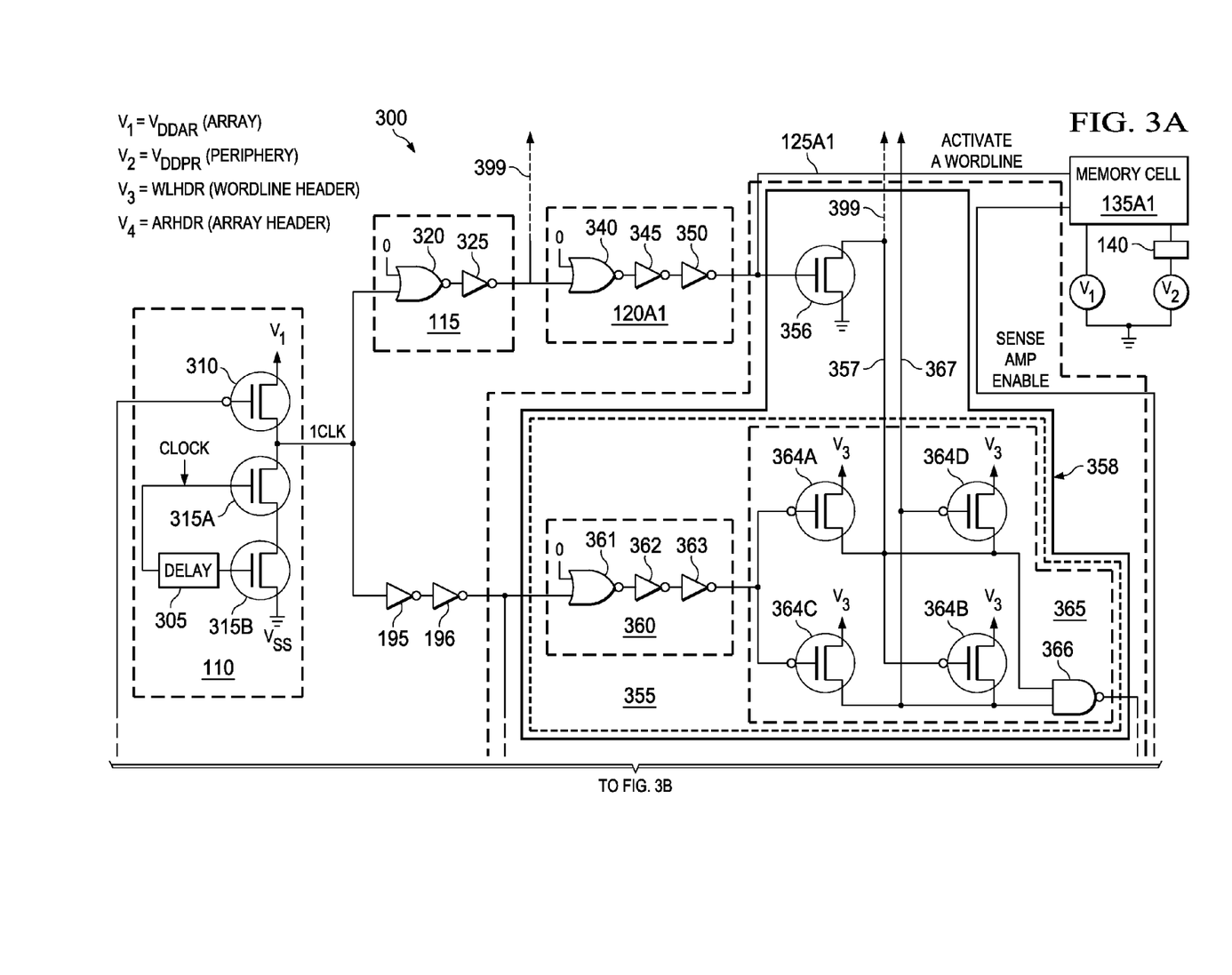
FIG. 3 is a partial schematic diagram of a section of a memory circuit including a tracking circuit, in accordance with one embodiment.
Figure 3B:
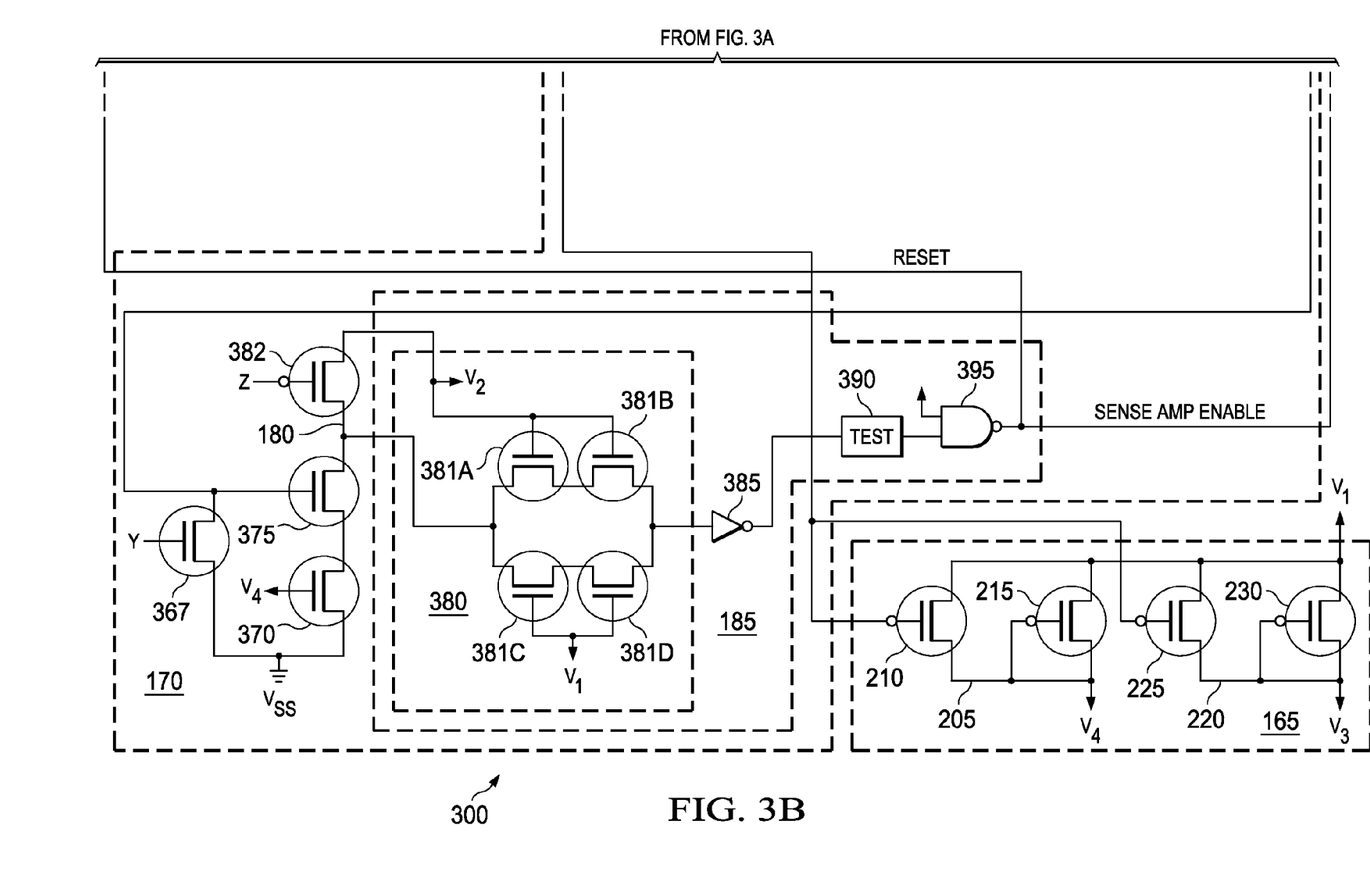

Referring to FIG. 3 now, a section 300 of the memory circuit 100 is provided. The section 300 includes the clock generator 110, the predecoder clock circuit 115, the wordline driver 120A1, the wordline 125A1, the memory cell 135A1, the peripheral circuitry 140, the tracking circuit 170, and the RTA switch 165.

The clock generator 110 includes a delay circuit 305, a positive metal oxide semiconductor (PMOS) transistor 310, a negative metal oxide semiconductor (NMOS) transistor 315A, and an NMOS transistor 315B. The delay circuit 305 receives the external clock signal (CLK) and has an output terminal coupled to a gate of the transistor 315B. The transistor 310 has a source coupled to the array power supply, and a gate that receives the reset signal (RESET). The NMOS transistor 315A has a drain coupled to a drain of the PMOS transistor 310 and a source coupled to a drain of the NMOS transistor 315B. The NMOS transistor 315B has a source coupled to a ground supply (VSS).

The delay circuit 305 may have an architecture equivalent to existing delay circuits and can include various components, for example inverters.

The predecoder clock circuit 115 includes a NOR gate 320 and an inverter 325. The NOR gate 320 has two input terminals. One input terminal is configured to receive a plurality of address lines and other input terminal is coupled to drains of the PMOS transistor 310 and the NMOS transistor 315A to receive the clock signal. An output terminal of the NOR gate 320 is coupled to an input terminal of the inverter 325. An output terminal of the inverter 325 is coupled to the wordline driver 120A1. The wordline driver 120A1 is coupled to the wordline 125A1 which in turn is coupled to the memory cell 135A1.

In one example, there are 16 wordlines (not shown but indicated by arrows 399). The wordlines are in turn coupled to respective memory cells. There are also 16 wordline drivers present (not shown but indicated by arrows 399). Each word line driver includes a NOR gate having an output terminal coupled to an inverter which in turn has an output terminal coupled to another inverter. For example, the wordline driver 120A1 includes a NOR gate 340 having the output terminal coupled to an inverter 345 which in turn has the output terminal coupled to an inverter 350. The inverter 345 and the inverter 350 are supplied with the WLHDR.

For 32 wordlines, two blocks can be present. Each block can include 16 wordlines and corresponding memory cells.

To track the wordline path from the clock generator 110 to the wordlines, it is desired to have a replica path similar to that of the wordline path. The replica path includes an inverter 195 having input terminal coupled to the drains of the PMOS transistor 310 and the NMOS transistor 315A. The inverter 196 is coupled to output terminal of the inverter 195. The inverter 195 delays the clock signal by a delay equivalent to that generated by the NOR gate 320. The inverter 196 also generates a delay similar to that by the inverter 325. The inverter 195 and the inverter 196 receive the $V_{DDPR}$.

The tracking circuit 170 includes the second circuit 185, a circuit 358 (third circuit), the dummy bit line 180, and a pair of NMOS transistors, for example an NMOS transistor 375 and an NMOS transistor 370. In some embodiments, the tracking circuit 170 can also include an NMOS transistor 367. The circuit 358 and the pair of NMOS transistors form the first circuit 175. The circuit 358 includes a circuit 365 (fourth circuit).

The tracking circuit 170 also includes one NMOS transistor for one wordline. Hence, the tracking circuit 170 includes 32 NMOS transistors for 32 wordlines. Gates of each of such NMOS transistors are coupled to a corresponding wordline. For example, an NMOS transistor 356 (first NMOS transistor) having a gate coupled to the wordline 125A1. The tracking circuit 170 further includes electrical lines, for example an electrical line 357 for 16 wordlines. The electrical line 357 is coupled to drains of 16 NMOS transistors.

A circuit 360 (fifth circuit) is similar to the wordline drivers, for example, the wordline driver 120A1. The circuit 360 includes a NOR gate 361. The circuit 360 also includes an inverter 362 having an input terminal coupled to an output terminal of the NOR gate 361. Further, the circuit 360 includes an inverter 363 having an input terminal coupled to an output terminal of the inverter 362 and having an output terminal coupled to a circuit 365 (fourth circuit). The NOR gate 361 is similar to the NOR gate 340, the inverter 362 is similar to the inverter 345, and the inverter 363 is similar to the inverter 350.

The circuit 365 includes two pairs of cross-coupled PMOS transistors. A first pair includes a PMOS transistor 364A (first PMOS transistor) and a PMOS transistor 364B (second PMOS transistor). The PMOS transistor 364A has a source coupled to the RTA switch 165 to receive the WLHDR, has a gate coupled to the output terminal of the inverter 363, and has a drain coupled to the electrical line 357 and an input terminal of a NAND gate 366. The PMOS transistor 364B has a source coupled to the RTA switch 165 to receive the WLHDR, has a gate coupled to the drain of the PMOS transistor 364A, to the electrical line 357 and to the input terminal of the NAND gate 366, and has a drain coupled to another input terminal of the NAND gate 366 and to an additional electrical line 367. The drain of the PMOS transistor 364A defines output of the first pair. Similarly, another pair of PMOS transistors includes a PMOS transistor 364C (first transistor) and a PMOS transistor 364D (second transistor). A drain of the PMOS transistor 364C defines the output of the second pair. The PMOS transistor 364C has a source coupled to the RTA switch 165 to receive the WLHDR, has a gate coupled to the output terminal of the inverter 363, and has a drain coupled to the additional electrical line 367 and to the NAND gate 366. The PMOS transistor 364D has a source coupled to the RTA switch 165 to receive the WLHDR, has a gate coupled to the drain of the PMOS transistor 364C, to the additional electrical line 367 and to the NAND gate 366, and has a drain coupled to the NAND gate 366 and to the electrical line 357.

The NMOS transistor 375 is coupled in series connection with the NMOS transistor 370. A drain of the NMOS transistor 375 is coupled to the dummy bit line 180 and a source of the NMOS transistor 370 is coupled to the ground supply ($V_{ss}$).

The second circuit 185 includes two pairs of NMOS transistors in series connection. A first pair of NMOS transistors in series connection includes an NMOS transistor 381A (first NMOS transistor) and an NMOS transistor 381B (second NMOS transistor). A drain of the NMOS transistor 381A is coupled to the dummy bit line 180 and a source of the NMOS transistor 381B is coupled to an input terminal of an inverter 385. The gates of the NMOS transistor 381A and of the NMOS transistor 381B are coupled to the peripheral voltage supply. Similarly, a second pair of NMOS transistors in series connection includes an NMOS transistor 381C and an NMOS transistor 381D. A drain of the NMOS transistor 381C is coupled to the dummy bit line 180 and a source of the NMOS transistor 381D is coupled to the input terminal of the inverter 385. The gates of the NMOS transistor 381C and of the NMOS transistor 381D are coupled to the array voltage supply.

The second circuit 185 further includes a testing circuit 390, for example a discrete Fourier transform delay circuit, having an input terminal coupled to an output terminal of the inverter 385. An output terminal of the testing circuit 390 is coupled to an input terminal of a NAND gate 395. Another input terminal of the NAND gate 395 is configured to receive a disable signal (ST_DISABLE). An output terminal of the NAND gate 395 is coupled to the pulse generator 190 (not shown in FIG. 3).

The operation of the section 300 is now explained.

Initially, the external clock signal (CLK) is received to generate the clock signal (ICLK) and initiate a read operation. The NMOS transistor 315A and the NMOS transistor 315B are active to generate the clock signal at logic level LOW. The NOR gate 320 generates an output signal at logic level HIGH. Output of the inverter 325 is at logic level LOW which selects a wordline driver, for example the wordline driver 120A1, corresponding to a desired memory cell, for example the memory cell 135A1, that needs to be accessed. The wordline driver 120A1 drives the wordline 125A1 to logic level HIGH. The output of the inverter 325 is referred to as "a first clock signal".

A second clock signal is also generated at logic level LOW by delaying the clock signal using the inverter 195 and the inverter 196. Output of the inverter 196 is referred to as "the second clock signal". The RTA switch 165 generates the ARHDR (first signal) and the WLHDR in response to the second clock signal. The ARHDR is initially precharged to $V_{DDAR}$.

The NOR gate 361 generates an output at logic level HIGH in response to the second clock signal and a block select signal (BLK_SEL). The block select signal enables selection of a desired block, for example the block including the wordline 125A1 and the memory cell 135A1. The PMOS transistor 364A and the PMOS transistor 364C are inactive as the output of the inverter 363 is at logic level HIGH. Initially, the electrical line 357 and the additional electrical line 367 are charged to logic level HIGH using the PMOS transistor 364A and the PMOS transistor 364C.

The wordline driver 120A1 drives the wordline 125A1 to logic level HIGH in response to the first clock signal and the WLHDR. Driving of the wordline 125A1 to the logic level HIGH renders the memory cell 135A1 ready for access. When the wordline 125A1 is driven at logic HIGH, the NMOS transistor 356 becomes active and provides a discharge path to the electrical line 357. The electrical line 357 discharges through the NMOS transistor 356 to logic level LOW. As the electrical line 357 reaches the logic level LOW, the PMOS transistor 364B becomes active to maintain the additional electrical line 367 at logic level HIGH. The NAND gate 366 is responsive to the discharge of the electrical line 357 to generate a wordline activation signal at logic level HIGH. The discharge of the electrical line 357 is indicative of the wordline 125A1 being driven HIGH. Hence, the wordline path from the clock generator 110 to the wordline 125A1 is tracked accurately. Even if precharging of the wordline 125A1 is slow due to variation in the WLHDR, the variation is tracked. The variation is tracked as precharging of the electrical line 357 and the additional electrical line 367 are also slow, due to the inverter 362 and the inverter 363 receiving the WLHDR. Hence, the tracking circuit 170 also tracks an RTA path by tracking variation in the WLHDR. The RTA path can be defined as a path from the clock generator 110 to the inverter 195 to the inverter 196 to the RTA switch 165 to generation of the WLHDR. Similarly, the ARHDR is also tracked by the tracking circuit 170. A replica path of the wordline path is also provided by the tracking circuit 170.

The NAND gate 366 generates the wordline activation signal in conjunction with the circuit 365 and the circuit 360. The circuit 360 aids generation of the wordline activation signal in response to the WLHDR. The wordline activation signal generated at the logic level HIGH activates the NMOS transistor 375. The NMOS transistor 370 is also active in response to the ARHDR (first signal). The dummy bit line 180 then discharges through the NMOS transistor 375 and the NMOS transistor 370 based on the logical AND combination of the ARHDR and the wordline activation signal. In some embodiments, the section 300 also includes an NMOS transistor 367 having a gate configurable to receive a signal (Y) to aid discharge of the dummy bit line 180. The signal Y can be received from an address comparator (not shown) in order to prevent an out of bound address condition.

The dummy bit line 180 is precharged using a PMOS transistor 382. The dummy bit line 180 is coupled to a drain of a PMOS transistor 382. The PMOS transistor 382 has a source coupled to the peripheral voltage supply and has a gate configurable to receive a delayed version of the second clock signal to precharge the dummy bit line 180.

The operation of the second circuit 185 is now explained in further detail. The second circuit 185 tracks discharging of the dummy bit line 180 across peripheral voltage supply variations and generates the second signal based on the peripheral voltage supply variations and the array voltage supply variations. The second circuit 185 works on the peripheral voltage supply ($V_{DDPR}$) and hence, is able to track variations in the peripheral voltage supply. The second circuit 185 is also able to track variations in the array voltage supply ($V_{DDAR}$). The NMOS transistor 381A and the NMOS transistor 381B pass the logic level LOW of the dummy bit line 180 to the inverter 385. The NMOS transistor 381A and the NMOS transistor 381B pass the logic level LOW based on peripheral voltage supply variations. Similarly, the NMOS transistor 381C and the NMOS transistor 381D pass the logic level LOW based on array voltage supply ($V_{DDAR}$) variations.

The inverter 385 is operable to invert logic level LOW of the dummy bit line 180 for generating the reset signal (RESET, second signal). In some embodiments, the testing circuit 390 tests delay in the reset signal and can add further delay to the reset signal. The NAND gate 395 then outputs the reset signal at logic level HIGH. The reset signal is supplied to the clock generator 110 to switch OFF operation of the wordline drivers and other circuitry. The reset signal is also supplied to the pulse generator 190 (not shown) that generates the enable signal (ENSA) to enable the sense amplifier 160A1 (not shown) to access the memory cell 135A1. Driving of the wordline 125A1 to logic level HIGH enables the memory cell 135A1 to generate a differential voltage across the bit lines BL1 and BLB1. The generation of the enable signal is delayed by a time that the memory cell 135A1 requires to generate the differential voltage from generation of the clock signal. The delay is enabled by tracking the entire path from the clock generator 110 to the memory cell 135A1 using the tracking circuit 170. The sense amplifier 160A1 (not shown in FIG. 3) is responsive to the enable signal to sense the differential voltage and hence, access the memory cell 135A1 at a time when the memory cell 135A1 is ready to be accessed. The second circuit 185 enables access to the memory cell 135A1 at a desired time by introducing a delay between time of discharge of the dummy bit line 180 and time to access the memory cell 135A1 based on the voltage peripheral supply variations and the array voltage supply variations.

The tracking can be affected with variations in the $V_{DDAR}$ and the $V_{DDPR}$. However, as a circuit 380 is supplied with both the $V_{DDAR}$ and the $V_{DDPR}$, effect due to variations in the $V_{DDAR}$ or the $V_{DDPR}$ are eliminated.

The effect of the second circuit 185 can be controlled using the ST_disable signal supplied to an input terminal of the NAND gate 395.

The tracking circuit 170 works in both the RTA mode and the non-RTA mode, and hence no fixed delay or worst case delay needs to be present in generation of the enable signal to access the memory cell. Hence, there is no penalty in terms of performance of the memory circuit 100. The tracking circuit 170 tracks the wordline path in both the RTA mode and the non-RTA mode, and hence, aids in generation of the enable signal with a delay that is appropriate to enable accurate reading of the memory cell. The tracking circuit 170 thus enables the memory circuit 100 to have self-time generation of the enable signal to perform accurate read or write operation.

Figure 4:
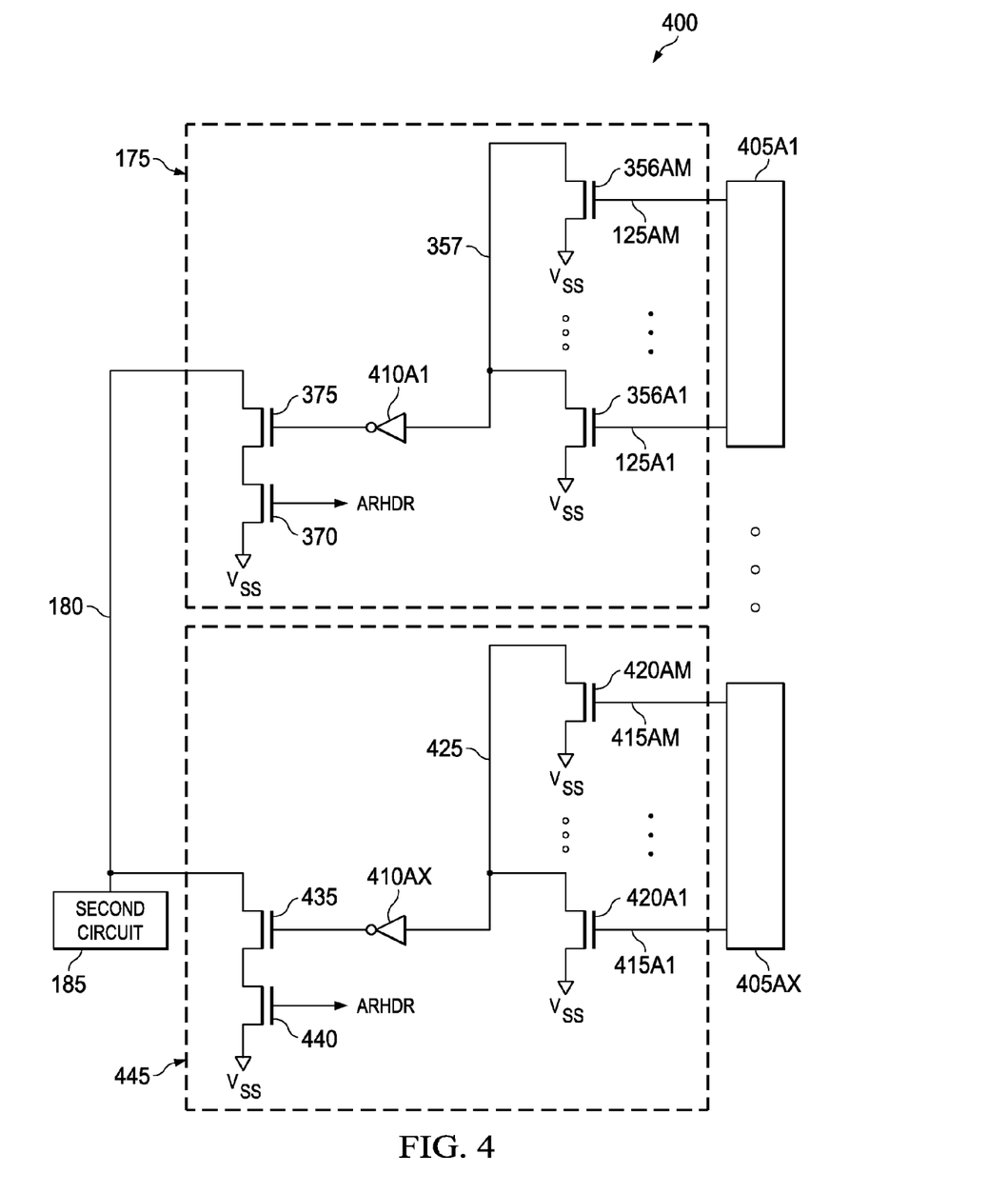
FIG. 4 illustrates a section of a memory circuit including a tracking circuit, in accordance with another embodiment.

Referring to FIG. 4 now, a section 400 of the memory circuit 100 is illustrated. The section 400 includes several blocks of wordlines and memory rows. Examples of the blocks include a block 405A1 to 405AX. Each block includes 16 wordlines and memory cells. For example, the block 405A1 includes wordlines form a wordline 125A1 to a wordline 125AM, and several memory cells (not shown), for example the memory cell 135A1 to the memory cell 135AN.

There may be one first circuit for one block. For example, the first circuit 175 for the block 405A1 and a first circuit 445 for the block 405AX. Each first circuit, according to this example, includes 16 NMOS transistors, an electrical line, a pair of NMOS transistors and an inverter. For example, the first circuit 175 includes an NMOS transistor 356A1 (first transistor) having a gate coupled to the wordline 125A1 and a drain coupled to the electrical line 357 (first electrical line). The electrical line 357 is then coupled to an inverter 410A1. An output terminal of the inverter 410A1 is coupled to the gate of the NMOS transistor 375. The drain of the NMOS transistor 375 is coupled to the dummy bit line 180. The NMOS transistor 375 is coupled in series connection to the NMOS transistor 370. The gate of the NMOS transistor 370 is configured to receive the ARHDR (first signal). The dummy bit line 180 is coupled to the second circuit 185. Structure similar to that of the first circuit 175 exists for the first circuit 445.

The operation of the section 400 is now explained. The driving of the wordline 125A1 remains similar to that explained above with reference to FIG. 3. The NMOS transistor 356A1 becomes active in response to the wordline 125A1 driven to the logic level HIGH. The electrical line 357 which is precharged to logic level HIGH then starts discharging through the NMOS transistor 356A1. The inverter 410A1 inverts the logic of the electrical line 357 to generate inverted logic. The NMOS transistor 375 is activated in response to the inverted logic and the NMOS transistor 370 is also active in response to the ARHDR (first signal). The dummy bit line 180 discharges to logic level LOW through the NMOS transistor 375 and the NMOS transistor 370. The discharge of the dummy bit line 180 is then tracked across the peripheral voltage supply variations using the second circuit 185 (explained in FIG. 3). The accessing of the memory cell 135A1 using the section 400 and generation of the reset signal by the second circuit 185 is similar to that explained in the FIG. 3 using the section 300.

Figure 5:
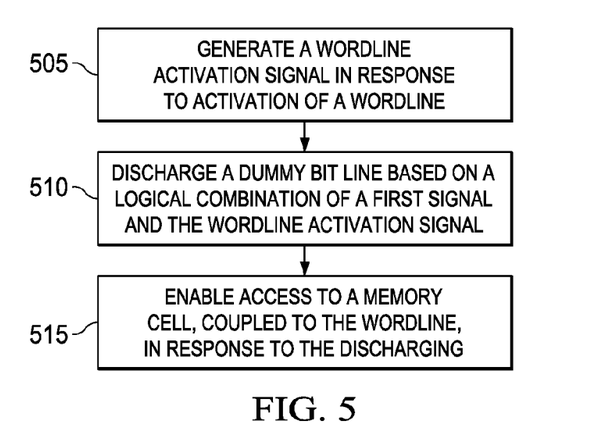
FIG. 5 is a flow diagram illustrating a method for tracking a memory circuit, in accordance with one embodiment.

Referring to FIG. 5 now, a method for tracking a memory circuit, for example the memory circuit 100, is provided.

At step 505, a wordline activation signal is generated in response to activation of a wordline. The wordline activation signal indicates that a memory cell coupled to wordline is ready for access.

At step 510, a dummy bit line coupled to the wordline is discharged based on a logical combination of a first signal, for example ARHDR, and the wordline activation signal. The first signal is indicative of a voltage of an array header of the memory circuit. In one embodiment, the dummy bit line is discharged based on a logical AND operation between the first signal and the wordline activation signal.

At step 515, access to the memory cell, coupled to the wordline, is enabled in response to discharging of the dummy bit line. In one embodiment, a voltage of the dummy bit line is inverted based on the peripheral voltage supply variations and the array voltage supply variations to cause access to the memory cell based on inverted voltage signal.

Figure 6:
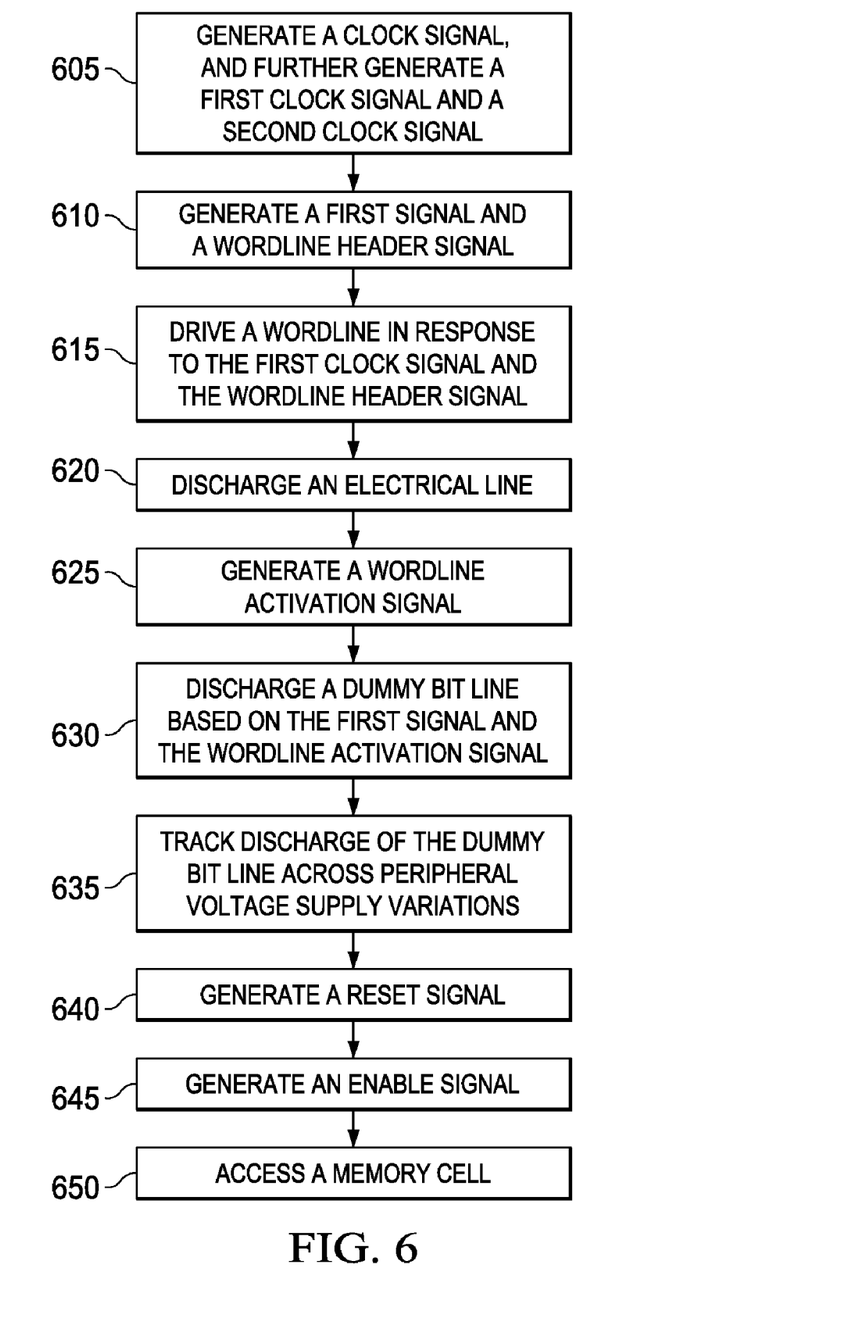
FIG. 6 is a flow diagram illustrating a method for accessing a memory cell in a memory circuit, in accordance with one embodiment.

Referring to FIG. 6 now, a method for accessing a memory cell, for example the memory cell 135A1 of FIG. 1, in a memory circuit, for example the memory circuit 100 of FIG. 1, is provided.

At step 605, a clock signal, also referred to as internal clock signal (ICLK), is generated in response to an external clock signal (CLK). The ICLK is generated in response to a rising edge of the CLK. A read operation is initiated on generation of the ICLK. The ICLK is generated, for example, by using the clock generator 110. A first clock signal and a second clock signal are then generated in response to the ICLK.

At step 610, a first signal and a wordline header signal are generated in response to the second clock signal. The first signal (ARHDR) is a voltage signal of an array header of the memory circuit. The second signal (WLHDR) is a voltage signal of a wordline header of the memory circuit. The first signal and the wordline header signal can be generated, for example, by using the RTA switch 165.

At step 615, a wordline, for example the wordline 125A1, is driven HIGH in response to the wordline header signal and the first clock signal. The wordline can be driven HIGH, for example, by using the wordline driver 120A1. The driving of the wordline renders the memory cell ready for access.

At step 620, an electrical line is discharged in response to driving of the wordline. The electrical line, for example the electrical line 357, can be discharged, for example, by using the NMOS transistor 356. The discharge of the first electrical line is indicative of the wordline being driven.

The electrical line is precharged, for example, by using the circuit 365 and the circuit 360.

At step 625, a wordline activation signal is generated in response to the discharge of the first electrical line. The wordline activation signal is generated, for example, by using the circuit 365. The wordline activation signal is at logic level HIGH.

At step 630, a dummy bit line, for example the dummy bit line 180, is discharged in response to the logical AND operation on the wordline activation signal and the first signal. The dummy bit line can be discharged, for example, by using the NMOS transistor 375 and the NMOS transistor 370.

The dummy bit line can be precharged in response to a delayed version of the second clock signal.

At step 635, the discharge of the dummy bit line is tracked across peripheral voltage supply ($V_{DDPR}$) variations, for example, by using the second circuit 185.

At step 640, a reset signal (RESET) is then generated, for example by using the inverter 385 in conjunction with the testing circuit 390 and the NAND gate 395. The reset signal is generated by adding a delay that is sufficient to enable the memory cell to be accessed at a time when the memory cell is ready to be accessed.

At step 645, an enable signal is generated in response to the reset signal, for example, by using the pulse generator 190.

At step 650, the memory cell is accessed in response to the enable signal, for example by using the sense amplifier 160A1.

The reset signal is also provided to the clock generator 110 to deactivate the clock signal. However, the second clock signal is generated continuously to enable self-timing by the memory circuit.

In some embodiments, step 620 and step 625 can be referred to as tracking a wordline path from a clock circuit, for example the clock circuit 105, to the wordline.

In the foregoing discussion, the term "coupled" refers to either a direct electrical connection between the devices connected or an indirect connection through one or more passive or active intermediary devices. The term "circuit" means at least either a single component or a multiplicity of components, that are connected together to provide a desired function. The term "signal" means at least one current, voltage, charge, data, or other signal.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description, but only by the Claims.

What is claimed is:

1. A tracking circuit comprising:
   a dummy bit line;
   a first circuit to discharge the dummy bit line in response to a first signal and a wordline activation signal, wherein the wordline activation signal causes activation of a memory cell; and
   a second circuit responsive to discharge of the dummy bit line to enable access to the memory cell;
   wherein the first circuit comprises:
   a third circuit to detect activation of a wordline and to generate the wordline activation signal in response to detection; and
   a plurality of transistors in series connection to discharge the dummy bit line in response to the first signal and the wordline activation signal;
   wherein the third circuit comprises:
   an electrical line;
   a first n-type metal oxide semiconductor (NMOS) transistor, having a gate coupled to the wordline and a drain coupled to the electrical line, to discharge the electrical line in response to the activation of the wordline; and
   a fourth circuit to generate the wordline activation signal in response to the discharge of the electrical line.

2. The tracking circuit as claimed in claim 1, wherein the first signal is indicative of voltage of an array header of a memory circuit, wherein the memory circuit comprises the memory cell.

3. The circuit as claimed in claim 1, wherein the fourth circuit comprises:
   a fifth circuit that is similar to a wordline driver of the wordline;
   two pairs of cross-coupled positive metal oxide semiconductor (PMOS) transistors each pair comprising at least one PMOS transistor having a gate coupled to an output of the fifth circuit to precharge the electrical line, and
   a NAND gate coupled to the electrical line to generate the wordline activation signal in response to the discharge of the electrical line.

4. The tracking circuit as claimed in claim 1, wherein the fourth circuit comprises an inverter to invert the voltage of the electrical line.

5. The tracking circuit as claimed in claim 1, wherein the first circuit is coupled to a retention-till-access (RTA) switch, the RTA switch generating the first signal.

6. The tracking circuit as claimed in claim 1, wherein the second circuit enables access to the memory cell at a desired time by introducing a delay between time of discharge of the dummy bit line and time to access the memory cell.

7. The tracking circuit as claimed in claim 1, wherein the second circuit comprises an inverter to invert voltage of the dummy bit line.

8. The tracking circuit as claimed in claim 7, wherein the second circuit further comprises:
- a first pair of n-type metal oxide semiconductor (NMOS) transistors in series connection, the first pair of NMOS transistors comprising
  - a first NMOS transistor having gate coupled to a peripheral voltage supply and having drain coupled to the dummy bit line, and
  - a second NMOS transistor having gate coupled to the peripheral voltage supply and having source coupled to the inverter; and
- a second pair of n-type metal oxide semiconductor (NMOS) transistors in parallel connection with the first pair of NMOS transistors, the second pair of NMOS transistors comprising
  - a third NMOS transistor having gate coupled to an array voltage supply and having drain coupled to the dummy bit line, and
  - a fourth NMOS transistor having gate coupled to the array voltage supply and having source coupled to the inverter.

9. The tracking circuit as claimed in claim 1, wherein the second circuit is coupled to a pulse generator, the pulse generator being responsive to the discharge of the dummy bit line to render a sense amplifier to access the memory cell.

* * * * *